METHOD OF ATTACHING LONG LEADS TO TERMINAL
PINS OF SEMICONDUCTOR MODULES
Filed Jan. 23, 1967

INVENTOR
Richard B. Small
BY Robert J. Crawford
ATTORNEY

United States Patent Office 3,456,339
Patented July 22, 1969

3,456,339

METHOD OF ATTACHING LONG LEADS TO TERMINAL PINS OF SEMICONDUCTOR MODULES

Richard B. Small, Dallas, Tex., assignor to Texas Instruments Incorporated, Dallas, Tex., a corporation of Delaware Filed Jan. 23, 1967, Ser. No. 611,541
Int. Cl. H01r *9/00;* H01b *13/00;* B21f *35/00*
U.S. Cl. 29—628 2 Claims

ABSTRACT OF THE DISCLOSURE

A method of attaching long leads to terminal pins by forming plural helical coils of wire and securing at least one portion of each coil to a terminal pin by soldering so that the free ends of the coils may be pulled and straightened to facilitate interconnecting.

This invention relates to electronic modules and more particularly relates to methods of attaching long leads to the terminal pins of the module.

In the electronics industry it is now common to mount discrete electronic components on a printed circuit board and interconnect these discrete devices into predetermined circuit arrangements. Electrical connections to the circuit junctions are made by means of terminal pins which are adapted to be plugged into the chassis of specified electronic equipment. Since these terminal pins must undergo mechanical handling during manufacture of the modules and since the pins are made so that they will be suitable for insertion into eletrical sockets, the terminal pins are by necessity of short length. In short, the terminal pins must be rigid in the nature of the pins of the common vacuum tube.

By use of semiconductor technology and devices, electronic modules have drastically decreased in size while the number of circuits function contained in the module have increased. Present day electronic modules may have, for example, as many as 16 pins extending from a module package area of less than two tenths of a square inch. In some circuit applications, it is not desired to plug these pins into a socket receptacle on a chassis, but it is instead desired to hand solder these pins into selected circuit arrangements. The terminal pins which extend from the module package are generally in the vicinity of one-eighth of an inch in length and spaced less than one-eighth of an inch apart and are not easily adapted to hand wiring and soldering techniques. It is therefore apparent that if the module is to be available for hand wiring applications, the terminal pins must be extended to such a length that they are accessible for manual handling.

It is therefore an object of this invention to provide a method for effectively extending the length of the terminal pins of electronic devices.

In carrying out the invention, conductive wire of the desired size and electrical characteristics is coiled into a tight or nearly tight helix and then cut to form helices of predetermined lengths. The predetermined lengths of helices are then dropped over the tinned pins on the semiconductor module and soldered thereto by soldering at the appropriate temperature. Following soldering of the helices to the pin, the free end of each helix may be pulled so that it straightens and extends to its full length.

Additional objects and advantages of the invention will be better understood in which presently preferred embodiments of the invention are presented by way of example. It is to be expressly understood, however, that the description is for purposes of illustration only and that the true spirit and scope of the invention is defined by the accompanying claims.

Figures 1, 2, 3:
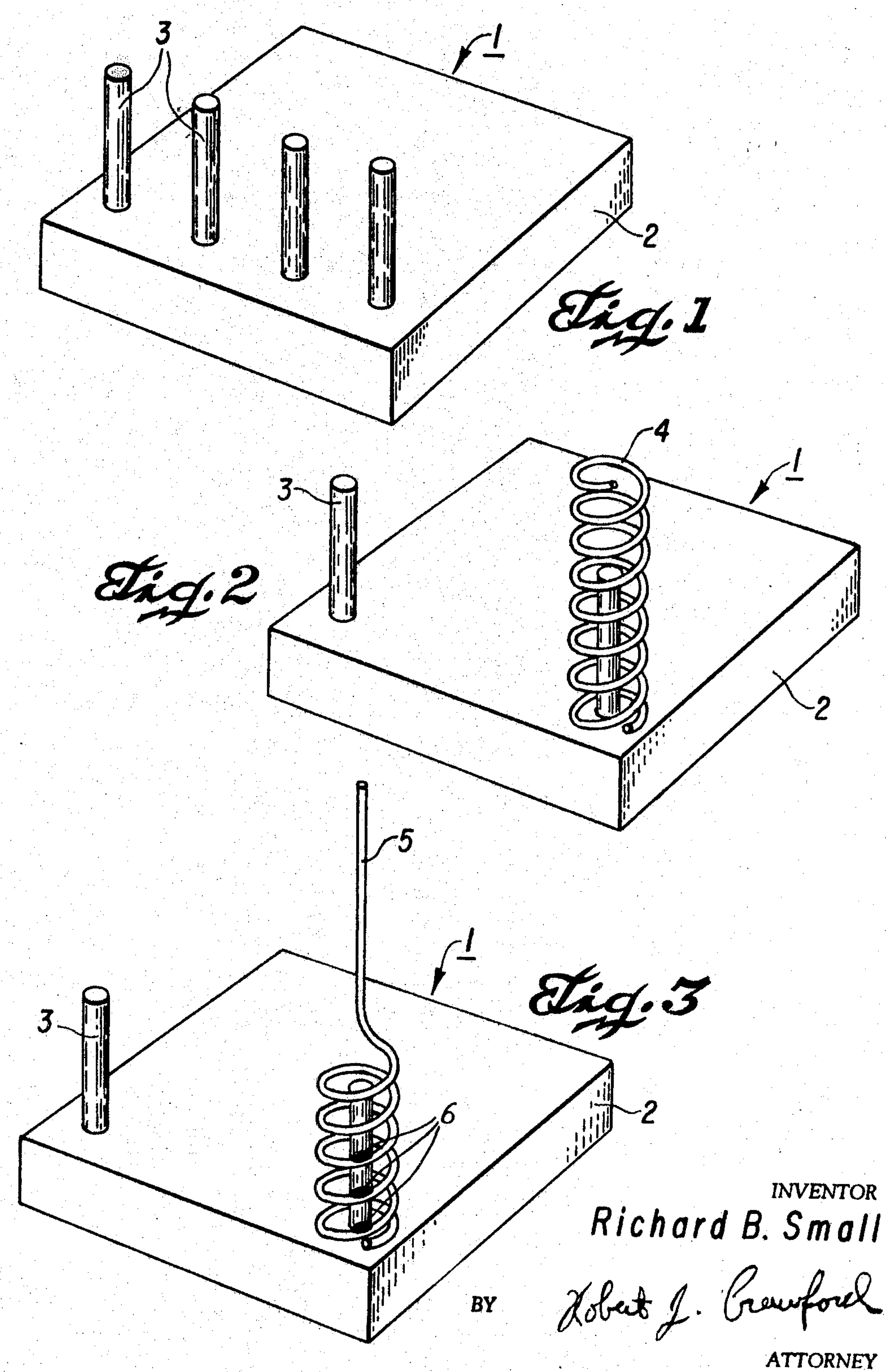
FIGURE 1 is a plan view of an electric module having terminal pins extending therefrom.
FIGURE 2 is a plan view of the module of FIGURE 1 illustrating tightly coiled helices placed over the individual terminal pins.
FIGURE 3 is a plan view of the module of FIGURE 2 after the wire helix has been soldered to the terminal pin as at 5 and stretched to extend to its full length.

Referring to FIGURE 1 of the drawing, a semiconductor module is indicated generally at 1 and comprises a housing 2 having electrical terminals 3 extending therefrom. The housing 2 may be metal or plastic as desired, and it is to be understood that contained in the housing 2 is one or more discrete electrical devices connected in predetermined circuit arrangement with pin 3 attached to the appropriate junctions thereof. The particular module illustrated in FIGURE 1 is a 16 terminal device with the terminal pins separated from each other by approximately one-eighth inch, the terminal pins being approximately one-eighth inch in length. For clarity, only 4 pins are shown.

Modules as shown in FIGURE 1 are particularly designed for insertion into sockets in the chassis of electronic apparatus. However, in many instances it is desired to utilize the circuitry contained in housing 2 for other purposes. For example, it may be desired to hand wire the circuit or circuits contained in the module to other and different circuits or devices. It will be appreciated that in such instances the close spacing of the terminals and the short lengths thereof make access to each individual terminal extremely difficult.

In FIGURE 2, illustrated is the module of FIGURE 1 in which the pins 3 have had solder applied thereto by any convenient means, such as by dipping the pins in paste solder, and helices 4 of predetermined length have been placed over the pins 3. The solder on the pins may be applied before or after the pins are inserted in the module. The helices may be conveniently made by coiling the selected diameter wire into a tight or nearly tight helix and then cutting the coiled helix into the prescribed length. The helices of the embodiment shown were formed by coiling 0.15" diameter wire onto a .022" mandrel, removing the coiled wire from the mandrel and cutting into ½" helices. The helices formed had a radius of about 0.23". The helices may be placed on the pins manually or by any conventional automatic feeding device. In the case of automatic feeding, it is important that the helix be tightly wound, especially at the ends, to prevent jamming in such equipment as a tube feeder. The helix must not be wound so tightly, however, that adjacent turns touch and solder together once solder heat is applied. After the helices are placed over the pin and a portion of the helices in contact therewith, the module may be placed in an oven and heated to the prescribed soldering temperature, such as for example, 200° C. or the pins and helices may be suitably heated by other means, such as by a hot blast of gas. It should also be noted that although the pins are pretinned, the wire which is coiled into helices may also be pretinned if desired. For convenience, only 2 pins are shown in FIGURE 2.

After the helices are soldered shown as 6 in FIGURE 3 to the pins and the solder has solidified as by cooling the end of the helix may be pulled in any manner desired to stretch the wire to the desired length as shown at 5 in FIGURE 3. It should be noted that for purposes of shipping, it may be desirable to leave the helix in its coiled form to conserve space and prevent tangling of the extended leads prior to use by the customer.

Although the invention has been described with particularity, it is understood that the disclosure has been made only by way of example and that numerous changes in the invention may be made without departing from the spirit and scope of the invention as hereinafter claimed.

What is claimed is:

1. The method of attaching long leads to the terminal pins of electronic modules comprising the steps of:
(a) dipping said terminal pins in solder paste to form a solder coating on at least a portion thereof;
(b) coiling an electrically conductive bare wire on a mandrel to form a helix which is nearly tightly coiled but which has sufficient spacing between turns to prevent soldering together of the adjacent turns in a subsequent soldering operation;
(c) removing said helix from said mandrel and cutting the helix into a plurality of helices of predetermined length;
(d) placing one of said helices of predetermined length over each of said terminal pins in such a manner that at least one portion contacts the pin and another portion of some of said helices extends beyond the end of said terminal pins; and
(e) heating and cooling said terminal pins and said helices such that each of said helices is soldered to the terminal pins, whereby the ends of each of said helices which extend beyond the ends of said terminal pins may be pulled to straighten said helices and whereby terminal leads of extended length are electrically and mechanically attached to said terminal pins.

2. The method of attaching long leads to the terminal pins of electronic modules comprising the steps of:
(a) dipping said terminal pins in solder paste to form a solder coating on at least a portion thereof;
(b) coiling an electrically conductive wire on a mandrel to form a helix which is nearly tightly coiled but which has sufficient spacing between turns to prevent soldering together of the adjacent turns in a subsequent soldering operation;
(c) removing said helix from said mandrel and cutting the helix into a plurality of helices of predetermined length;
(d) placing one of said helices of predetermined length over each of said terminal pins in such a manner that at least one portion contacts the pin and another portion of each of said helices extends beyond the end of said terminal pins;
(e) heating and cooling said terminal pins and said helices such that each of said helices is soldered to the terminal pins; and
(f) pulling the end of each of said helices which extends beyond the end of said terminal pins to straighten said helices whereby terminal leads of extended length are electrically and mechanically attached to said terminal pins.

References Cited

UNITED STATES PATENTS

| | | | |
|---|---|---|---|
| 2,902,629 | 1/1959 | Little et al. | 29—626 X |
| 2,923,859 | 2/1960 | Worth et al. | 174—68.5 X |
| 3,013,245 | 12/1961 | Osborn | 339—256 |
| 3,089,223 | 5/1963 | Walker | 174—94 X |
| 3,346,689 | 10/1967 | Parstorfer | 29—626 |

JOHN F. CAMPBELL, Primary Examiner

R. W. CHURCH, Assistant Examiner

U.S. Cl. X.R.

29—624, 626, 630, 173; 174—68.5; 339—256